(12) United States Patent
Seigler et al.

(10) Patent No.: US 8,098,520 B2
(45) Date of Patent: Jan. 17, 2012

(54) STORAGE DEVICE INCLUDING A MEMORY CELL HAVING MULTIPLE MEMORY LAYERS

(75) Inventors: Michael Seigler, Pittsburgh, PA (US); Oleg Mryasov, Bradford Woods, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 657 days.

(21) Appl. No.: 12/110,099

(22) Filed: Apr. 25, 2008

(65) Prior Publication Data

US 2009/0268506 A1    Oct. 29, 2009

(51) Int. Cl.
*G11C 11/15* (2006.01)
(52) U.S. Cl. ........................................... 365/173
(58) Field of Classification Search .................. 365/148, 365/145, 163, 158, 171, 173
See application file for complete search history.

(56) References Cited

U.S. PATENT DOCUMENTS

| | | | |
|---|---|---|---|
| 5,495,438 A | 2/1996 | Omura | 365/145 |
| 5,668,754 A | 9/1997 | Yamashita | 365/145 |
| 5,999,438 A | 12/1999 | Ohsawa | 365/145 |
| 6,438,019 B2 | 8/2002 | Hartner et al. | 365/133 |
| 6,541,375 B1 | 4/2003 | Hayashi et al. | 438/679 |
| 6,589,367 B2 | 7/2003 | Nomura et al. | 148/302 |
| 6,639,823 B2 | 10/2003 | Hasegawa | 365/145 |
| 6,704,218 B2 | 3/2004 | Rickes et al. | 365/145 |
| 6,744,086 B2 | 6/2004 | Daughton et al. | 257/295 |
| 6,753,561 B1 | 6/2004 | Rinerson et al. | 257/295 |
| 6,834,005 B1 | 12/2004 | Parkin | 365/80 |
| 6,856,534 B2 | 2/2005 | Rodriguez et al. | 365/145 |
| 6,898,132 B2 | 5/2005 | Parkin | 365/189.12 |
| 6,920,060 B2 | 7/2005 | Chow et al. | 365/145 |
| 6,920,062 B2 | 7/2005 | Parkin | 365/158 |
| 6,967,858 B2 | 11/2005 | Kang | 365/145 |
| 6,985,385 B2 | 1/2006 | Nguyen et al. | 365/173 |
| 7,031,178 B2 | 4/2006 | Parkin | 365/80 |
| 7,108,797 B2 | 9/2006 | Chen et al. | 216/22 |
| 7,126,841 B2 | 10/2006 | Rinerson et al. | 365/148 |
| 7,170,775 B2 | 1/2007 | Lin et al. | 365/158 |
| 7,190,611 B2 | 3/2007 | Nguyen et al. | 365/158 |
| 7,196,924 B2 | 3/2007 | Lai et al. | 365/145 |
| 7,230,844 B2 | 6/2007 | Deak | 365/171 |
| 7,304,881 B2 | 12/2007 | Rodriguez et al. | 365/145 |
| 8,014,193 B2 * | 9/2011 | Nakayama et al. | 365/158 |
| 2004/0062071 A1 | 4/2004 | Rodriguez et al. | 365/145 |
| 2004/0233744 A1 | 11/2004 | Rodriguez et al. | 365/200 |
| 2006/0226411 A1 | 10/2006 | Lee | 257/2 |
| 2009/0244957 A1 | 10/2009 | Clinton et al. | 365/158 |
| 2009/0244965 A1 * | 10/2009 | Reohr | 365/173 |
| 2009/0268515 A1 * | 10/2009 | Jeong et al. | 365/171 |

(Continued)

OTHER PUBLICATIONS

Persev et al., N.A.; Coercive field of ultrathin $Pb(Zr_{0.52}Tl_{0.48})$ epitaxial films, *Applied Physics Letters*, V. 83, N. 16, Oct. 20, 2003, pp. 3356-3358.

(Continued)

*Primary Examiner* — Vu Le
*Assistant Examiner* — Han Yang
(74) *Attorney, Agent, or Firm* — Mueting Raasch & Gebhardt PA

(57) ABSTRACT

In a particular illustrative embodiment, a storage device includes a controller and a plurality of resistive elementary memory cells accessible via the controller. Each resistive elementary memory cell of the plurality of resistive elementary memory cells includes a plurality of memory layers selected to have hysteretic properties to store multiple data values.

26 Claims, 11 Drawing Sheets

U.S. PATENT DOCUMENTS

2009/0303773 A1* 12/2009 Rinerson et al. ............. 365/148
2010/0226164 A1* 9/2010 Nagashima et al. .......... 365/148

OTHER PUBLICATIONS

Meyer & Waser, R. & R.; "Hysteretic Resistance Concepts in Ferroelectric Thin Films," *Journal of Applied Physics*, American Institute of Physics, 2006, pp. 051611-051611-8.

Velev et al., J.P.; "Effect of Ferroelectricity on Electron Transport in Pt/BaTiO$_3$/Pt Tunnel Junctions," *The American Physical Society*, 2007, pp. 137201-1-137201-4.

Zhuravlev et al., M.Ye.; "Giant Electroresistance in Ferroelectric Tunnel Junctions," Physical Review Letters. *The American Physical Society*, 2005, pp. 246802-1-246802-4.

Kohlstedt et al., H.; "Theoretical Current-Voltage Characteristics of Ferroelectric Tunnel Junctions," *Physical Review*, The American Physical Society, 2005, pp. 125341-1-125341-10.

"Current-Driven Magnetization Reversal and Spin-Wave Excitation in Co/Cu/Co Pillars", by J.A. Katine et al., *The American Physical Society*, 2000, pp. 3149-3152.

"Time-Domain Measurements of Nanomagnet Dynamics Driven by Spin-Transfer Torques", by I.N. Krivorotov et al., *Science*, Jan. 2005, pp. 228-231.

"Magnetic Configurations and Phase Diagrams of Sub-100-nm NiFe Nanorings", by N. Benatmane et al., *IEEE*, 2007, pp. 2884-2886.

"Finite-Temperature Modeling of Nanoscale Spin-Transfer Oscillators", by S.E. Russek et al., *Physical Review*, 2005, pp. 104425-1-104425-6.

* cited by examiner

US 8,098,520 B2

STORAGE DEVICE INCLUDING A MEMORY CELL HAVING MULTIPLE MEMORY LAYERS

BACKGROUND

The present disclosure is generally related to a storage device including a memory cell having multiple memory layers. More particularly, the present disclosure relates to non-magnetic memory cells adapted to store multiple data values.

Storage devices are widely used in many electronic applications for storing information. Such storage devices include hard disc drives, flash memory devices, magnetic random access memory (MRAM) devices, electrically erasable programmable read only memory (EEPROM) devices, other memory devices, or any combination thereof. Such storage devices may be used in a variety of applications, including computer systems, personal digital assistants (PDAs), mobile telephones, audio players, digital cameras, digital video recorders, set-top box devices, other electronic devices, or any combination thereof.

In general, technology advances have lead to smaller and lighter electronic devices with smaller storage devices. However, it can be difficult to reduce the size of the associated storage device without sacrificing storage capacity. Further, physical phenomena that are used to operate such storage devices may become difficult to implement as the size is reduced and noise and other interference that can adversely impact such phenomena, such as inter-symbol interference, cross-coupling noise, and other signal noise, can become more pronounced.

SUMMARY

In a particular illustrative embodiment, a storage device includes a controller and a plurality of resistive elementary memory cells accessible via the controller. Each resistive elementary memory cell of the plurality of resistive elementary memory cells includes a plurality of memory layers selected to have hysteretic properties to store multiple data values.

In another particular embodiment, a memory device includes a first electrode, a second electrode, and multiple memory layers to store multiple data values between the first and second electrodes. Each memory layer of the multiple memory layers has a hysteretic property to store a data value of the multiple data values. The memory device further includes a controller coupled to the multiple memory layers via at least one of the first and second electrodes. The controller reads the multiple data values from one or more of the multiple memory layers without altering the multiple data values.

In still another particular embodiment, a memory device includes a plurality of resistive memory cells. Each resistive memory cell includes multiple stacked memory layers to store multiple data values. Each memory layer of the multiple stacked memory layers has an unique hysteretic property configurable to represent a unique data value. The memory device further includes a controller having access to the plurality of resistive memory cells. The controller is adapted to select a resistive memory cell of the plurality of resistive memory cells and to read and write data from and to a selected memory layer of the selected resistive memory cell.

DETAILED DESCRIPTION OF ILLUSTRATIVE EMBODIMENTS

Figure 1:
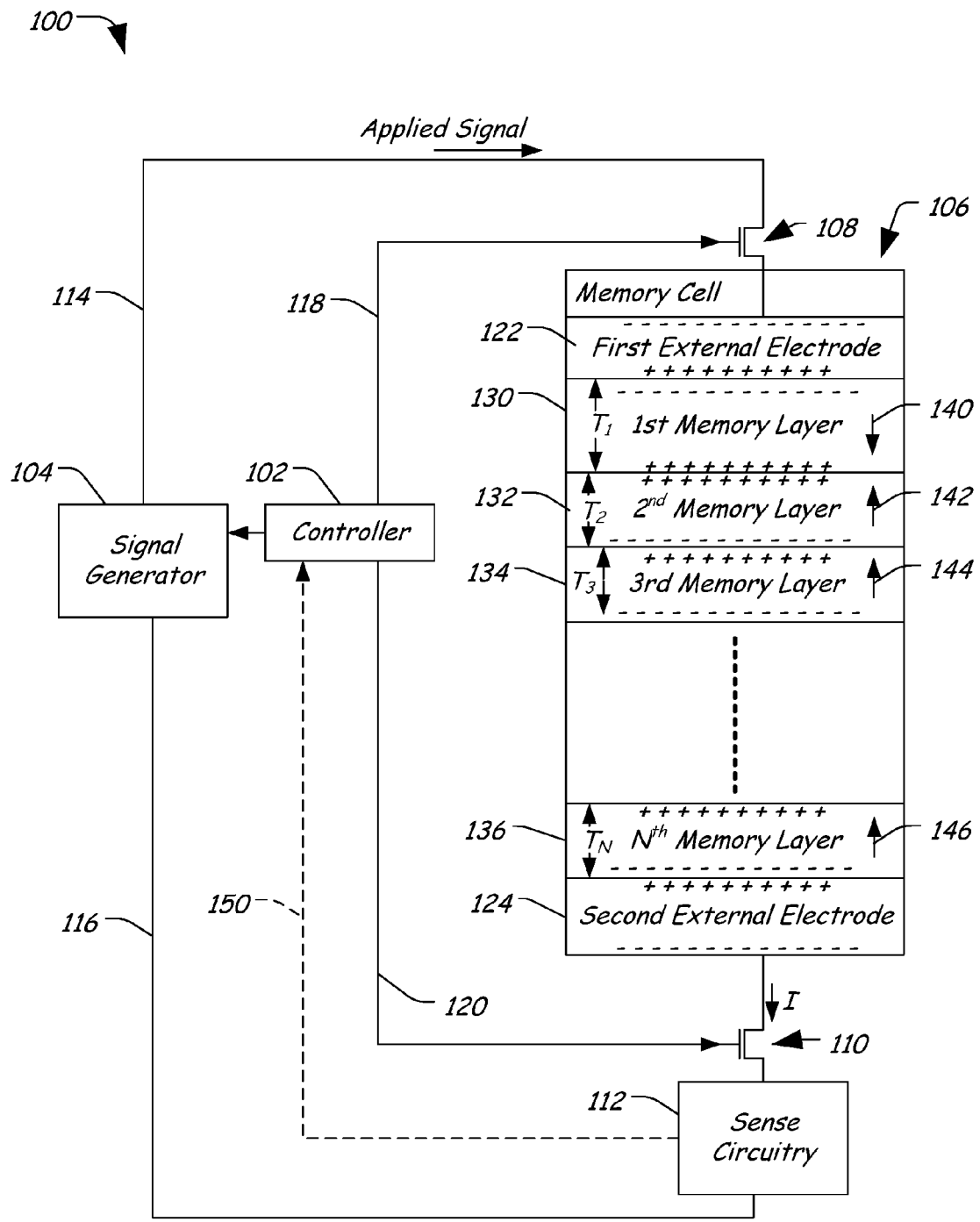
FIG. 1 is a diagram of a particular illustrative embodiment of a storage device including a memory cell having multiple stacked memory layers.

FIG. 1 is a diagram of a particular illustrative embodiment of a storage device 100 including a memory cell 106 having multiple stacked memory layers. The storage device 100 includes a controller 102 that communicates with a signal generator 104 to provide an applied signal to the memory cell 106 via lines 114 and 116. In a particular embodiment, the controller 102 can include the signal generator 104. The controller 102 is also coupled to a first switch 108 via line 118 and to a second switch 110 via a line 120 to selectively access the memory cell 106. The storage device 100 further includes sense circuitry 112 that is selectively coupled to the memory cell 106 via the second switch 110 to receive an electrical current (I), which represents data stored at the memory cell 106. The sense circuitry 112 is adapted to determine a tunneling resistance associated with the memory cell 106, to determine data values stored at the memory cell 106, or any combination thereof. In a particular example, the controller 102 receives data related to the detected tunneling resistance from sense circuitry 112 via a line 150.

The memory cell 106 includes multiple stacked memory layers, including a first memory layer 130, a second memory layer 132, a third memory layer 134, and an N-th memory layer 136, which are sandwiched between a first external electrode 122 and a second external electrode 124. The first external electrode 122 is coupled to the first switch 108 and the second external electrode 124 is coupled to the second switch 110.

In a particular illustrative embodiment, the first, second, third, and N-th memory layers 130, 132, 134, and 136 are selected to have hysteretic properties. As used herein, the term "hysteretic property" refers to a non-volatile memory effect resulting from a material having two or more stable states due to an electrical property, such as a polarization of an electrical field, a trapped electron charge, other non-magnetic properties, or any combination thereof. In a particular embodiment, the hysteretic property includes an electrical hysteresis associated with ferroelectric material where the polarization is an electrical dipole moment that impacts electron charge distributions to control a tunneling resistance. In another example, the hysteretic property includes a spontaneous polarization property. For example, in a particular embodiment, the first, second, third, and N-th memory layers 130, 132, 134, and 136 may be formed from ferroelectric material that is adapted to carry an electrical field having a polarization orientation. In another particular embodiment, the first, second, third, and fourth memory layers 130, 132, 134, and 136 may be formed from a phase change material, a charge trap material, or other material having a hysteretic property that can be configured to represent a data value. In a particular example, each of the first, second, third, and n-th memory layers 130, 132, 134, and 136 are formed from ferroelectric materials having different doping concentrations, different thickness, or other differences that result in unique hysteretic properties, such that a data value stored at a particular memory layer has a unique impact on the tunneling resistance and may be altered by a unique write signal without impacting other stored data values within the memory cell 106.

In a particular example, each of the first, second, third, and n-th memory layers 130, 132, 134, and 136 are is formed from a ferroelectric material having different (unique) hysteretic properties. For example, the first memory layer 130 has a first thickness ($T_1$) and carries a first electrical field having a first polarization orientation 140. The second memory layer 132 has a second thickness ($T_2$) and carries a second electrical field having a second polarization orientation 142. The third memory layer 134 has a third thickness ($T_3$) and carries a third electrical field having a third polarization orientation 144. The n-th memory layer 136 has an n-th thickness ($T_N$) and carries an n-th electrical field having an n-th polarization orientation 146. In a particular embodiment, the memory cell 106 can include any number of memory layers having unique hysteretic properties. In a particular embodiment, the first, second, third, and n-th polarization orientations 140, 142, 144, and 146 induce charge distributions within each of the first, second, third, and n-th memory layers 130, 132, 134, and 136. The charge distributions within the memory layers 130, 132, 134, and 136 also cause a charge distribution at the first and second external electrodes 122 and 124. Further, the charge distributions affect a tunneling resistance through the memory cell 106. In a particular embodiment, the tunneling resistance through the memory cell 106 represents data values stored at each of the first, second, third, and n-th memory layers 130, 132, 134, and 136.

In another particular example, each of the first, second, third, and n-th memory layers 130, 132, 134, and 136 may be separated by internal electrodes. In this particular example, the first, second, third, and n-th polarization orientations 140, 142, 144, and 146 cause a clustering of an opposite charge in the adjacent internal electrodes.

In a particular embodiment, the controller 102 is adapted to read and write data from and to the memory cell 106 by selectively activating the first and second switches 108 and 110 via control signals applied to the lines 118 and 120, respectively. An applied signal at line 114 from the signal generator 104 can cause an electrical current to flow through the memory cell 106, and the sense circuitry 112 is adapted to determine a tunneling resistance associated with the memory cell 106 based on the electrical current (I). The tunneling resistance represents data values stored at one or more of the first, second, third, and n-th memory layers 130.

In general, while the above-discussion indicates that the first, second, third, and n-th memory layers 130, 132, 134, and 136 may be formed from a ferroelectric material, it should be understood that other materials may be used, including a resistive oxide (RO) material, a phase change (PC) material, a charge trap (CT) material, or any combination thereof. In the embodiment illustrated in FIG. 1, the first, second, third, and n-th memory layers 130, 132, 134, and 136 can be ferroelectric memory layers, where multiple resistance states originate from spontaneous electric polarization. However, if the memory layer is formed from the RO, PC, or CT materials, the multi-level resistance states can originate from similar charge distribution mechanisms that result in changes to the tunneling resistance of the memory cell 106.

In a particular embodiment, the tunneling resistances (i.e., the conductances) of the first, second, third, and n-th memory layers 130, 132, 134, and 136 can depend on the polarization orientations 140, 142, 144, and 146. In a particular example, the tunneling resistance the first memory layer 130 changes significantly as the polarization orientation 140 changes from paraelectric to ferroelectric. In a particular example, a change in the polarization orientation from an upward orientation to downward orientation detectably alter the tunneling resistance of the memory cell 106, such that the variation in the tunneling resistance may be used to determine data values stored at the memory cell 106.

In a particular illustrative example, the memory cell 106 includes the first, second, third, and n-th memory layers 130, 132, 134, and 136, which may be operated as resistive storage elements to store data values. In particular, the first, second, third, and n-th memory layers 130, 132, 134, and 136 may have bi-stable or tri-stable states, which can be utilized to represent data values. The memory cell 106 is a non-volatile memory. Further, the controller 102 is adapted to access the memory cell 106 to retrieve stored data without having to perform a read operation before a write operation. In particular, the memory cell 106 can be accessed without destroying the stored data (i.e., a read operation is not a destructive read). Further, the memory cell 106 may be employed as part of a multi-level solid-state memory device having any number of memory cells, with $2^N$ to $3^N$ states per memory layer, where N represents a number of memory layers.

Figure 3A:
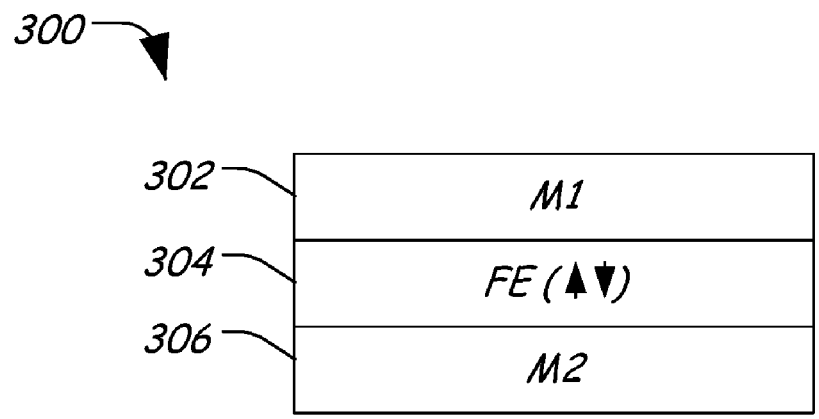
FIG. 3A is a block diagram of a particular illustrative embodiment of a memory location within a memory cell, which may have multiple stacked memory layers.
Figure 5A:
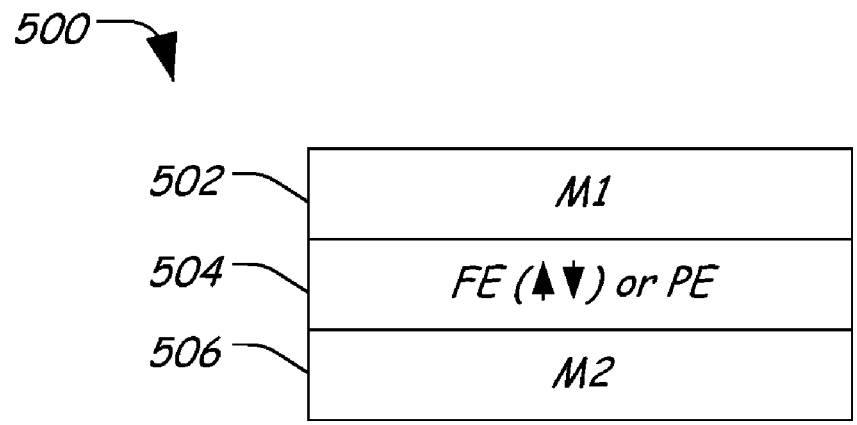
FIG. 5A is a block diagram of a third particular illustrative embodiment of a memory location of a memory cell, which may have multiple stacked memory layers.

In general, the memory cell 106 can be used as part of a multi-level solid state memory device with $m^C$ memory cells, where C represents the number of memory cells and where m represents a number of data levels stored at each memory cell. For example, the m value for a memory cell shown in FIG. 3A is two (i.e., m=2), and the m value for a memory cell shown in FIG. 5A is three (i.e., m=3). A memory cell with (K) memory layers can provide m=$2^K$ memory levels. Thus, in this particular example, a memory cell with two hysteretic memory layers is a four data-level memory cell.

In a particular illustrative embodiment, the first, second, third, and n-th memory layers 130, 132, 134, and 136 may be symmetric. In this instance, a bit value of one ("1") may be represented by an upward or a downward polarization orientation, since the symmetric junction provides the same tunneling resistance in either instance. A bit value of zero ("0") may be represented by a paraelectric orientation. In this example, each memory location has two possible states and the memory cell 106 has N memory locations (i.e., $2^N$ memory states). In another particular illustrative embodiment, the first, second, third, and n-th memory layers 130, 132, 134, and 136 may be asymmetric.

In another particular example, the first, second, third, and n-th memory layers 130, 132, 134, and 136 may have different hysteretic properties. In another particular example, the first, second, third, and n-th memory layers 130, 132, 134, and 136 may be separated by internal electrodes (such as electrode layers 752, 754, and 756 illustrated in FIG. 7C), by electrically insulated layers (such as insulator layers 722, 724, and 726 illustrated in FIG. 7B), by both insulator and electrode laysers (such as electrode 610 and insulator layer 622 illustrated in FIG. 6B), or any combination thereof. In a particular example, internal electrodes within a memory cell may be formed from different materials or different compositions (such as different doping concentrations). Similarly, the insulator layers may also be formed from different materials having different insulating properties.

In another particular embodiment, a critical voltage for changing a polarization of each memory layer (such as the polarization orientation 140 carried by the first memory layer 130) may be controlled by design parameters, such as the type of memory layer material, the memory layer composition, and the memory layer thickness. Additionally, adjacent materials may impact the critical voltage. Further, the thickness and type of interlayer materials may also impact the critical voltage. By adjusting a thickness of the memory layers within a memory cell having multiple stacked memory layers, each memory location may have a different critical voltage, which may be selectively applied by the controller 102 via the signal generator 104 to alter a polarization orientation of a particular memory layer within the multiple stacked memory layers, without altering a polarization orientation of the other memory layers.

In a particular example, the first memory layer 130 may have a thickness ($T_1$) that is greater than a thickness ($T_2$) of the second memory layer 132. In this example, the tunneling resistances associated with the first memory layer 130 and the second layer 132 may be unique, such that the sense circuitry 112 can be used to determine a stored data value at a particular memory location, such as the first memory location 130 based on the tunneling resistance for the memory cell 106.

In a particular embodiment, the storage device 100 includes a controller 102 and a plurality of resistive elementary memory cells, such as the memory cell 106, which are accessible via the controller 102. The resistive elementary memory cell 106 includes a plurality of memory layers, such as the first, second, third, and n-th memory layers 130, 132, 134, and 136, which are selected to have hysteretic properties to store multiple data values. In a particular embodiment, the first memory layer 130 has a first hysteretic property and the second memory layer 132 has a second hysteretic property. In yet another particular embodiment, the resistive elementary memory cell 106 stores multiple data values that are represented by a unique tunneling resistance. In a particular example, the controller 102 is adapted to apply a unique write signal to the resistive elementary memory cell 106 to alter the unique tunneling resistance through the resistive elementary memory cell 106 to represent different data values. In a particular example, the memory cell 106 may be selected from multiple memory cells or may be selected as part of a group or block of memory cells.

In another particular example, the memory device 100 includes a first electrode 122, a second electrode 124, and multiple memory layers 130, 132, 134, and 136 between the first and second electrodes 122 and 124 to store multiple data values. Each of the memory layers 130, 132, 134, and 136 has a hysteretic property to store a data value of the multiple data values. The memory device 100 further includes a controller 102 that is coupled to the multiple memory layers 130, 132, 134, and 136 via at least one of the first and second electrodes 122 and 124. The controller reads the multiple data values from the multiple memory layers 130, 132, 134, and 136 without altering the multiple data values. In a particular example, the multiple memory layers 130, 132, 134, and 136 are ferroelectric layers adapted to carry independent polarized electrical fields to induce electron charge distributions representing unique data values. In another particular example, the multiple memory layers 130, 132, 134, and 136 are phase change media layers having hysteretic properties that can be independently configured to represent unique data values. In yet another particular embodiment, the multiple memory layers 130, 132, 134, and 136 are charge trap layers to trap electrical charges. The charge trap layers are configurable to induce an electron charge distribution within the charge trap layer and at adjacent layers to alter a tunneling resistance to represent unique data values.

In general, it should be understood that the particular example of a storage device 100 provided in FIG. 1 is a representative example only, and is not intended to be limiting. Other structures for applying a voltage or current and determining a tunneling resistance through the memory cell 106 may also be used. Further, it should be understood that the particular storage device 100 is described with respect to bit-addressable storage. However, in a particular embodiment, the storage device 100 may access a block of memory cells to provide a block-accessible storage. Additionally, other configurations may be used, depending on the particular implementation.

Figure 2:
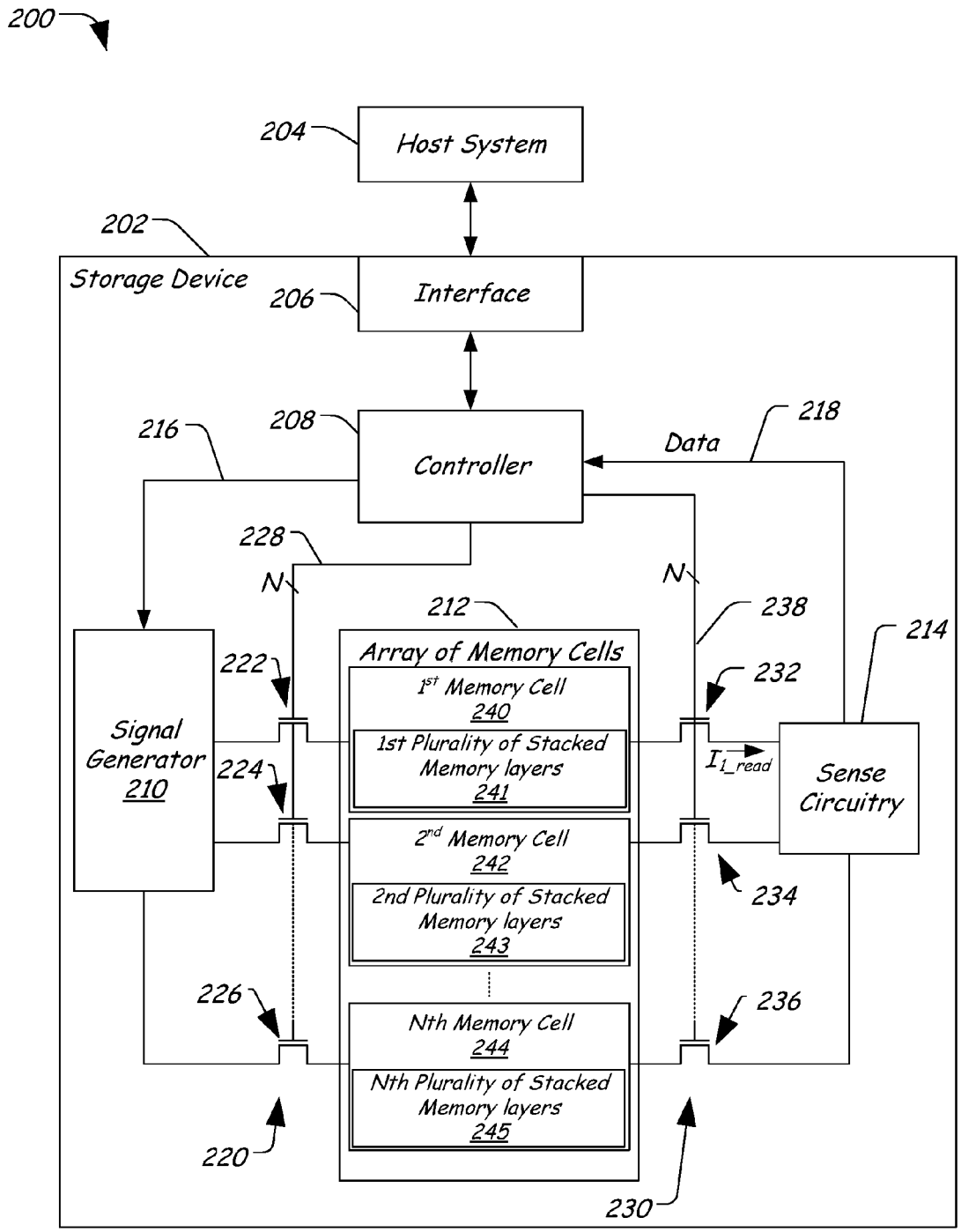
FIG. 2 is a diagram of a second particular illustrative embodiment of a system including multiple memory cells having multiple stacked memory layers.

FIG. 2 is a diagram of a second particular illustrative embodiment of a system 200 including a storage device 202 that has a memory cell having multiple stacked memory locations. The system 200 includes a host system 204, which may be a computer, a wireless telephone, a personal digital assistant (PDA), a music player device (such as an MP3 player), another electronic device, processing logic, or any combination thereof. The host system 204 is coupled to the storage device 202 via an interface 206, such as an Advanced Technology Attachment (ATA) interface, an Integrated Drive Electronics (IDE) interface, a Universal Serial Bus (USB) interface, small computer system interface (SCSI), another interface, or any combination thereof. In a particular example, the host system 204 may communicate wirelessly with the interface 206 of the storage device 202 via a wireless communications protocol. In this particular example, the interface 206 may include a wireless transceiver (not shown).

The storage device 202 further includes a controller 208 that is coupled to the interface 206. The controller 208 is also coupled to a signal generator 210 via line 216. The signal generator 210 is adapted to generate a signal at a selected voltage or current level. Additionally, the signal generator 210 is coupled to a storage media that includes an array of memory cells 212 via a first plurality of switches 220. The array of memory cells 212 is coupled to sense circuitry 214 via a second plurality of switches 230. The first plurality of switches 220 and the second plurality of switches 230 are selectively activated by the controller 208 via first and second lines 228 and 238 to access a selected memory cell of the array of memory cells 212. The sense circuitry 214 is coupled to the controller 208 via a data line 218. In a particular embodiment, the sense circuitry 214 is adapted to determine a tunneling resistance of a particular memory cell of the array of memory cells 212, such as a first memory cell 240, and to determine data values stored at the particular memory cell based on the determined tunneling resistance.

The array of memory cells 212 includes the first memory cell 240 having a first plurality of stacked memory layers 241. The first memory cell 240 is coupled to the signal generator 210 via a first switch 222 and is coupled to the sense circuitry 214 via a second switch 232. Additionally, the array of memory cells 212 includes a second memory cell 242 having a second plurality of stacked memory layers 243. The second memory cell 242 is coupled to the signal generator 210 via a third switch 224 and is coupled to the sense circuitry 214 via a fourth switch 234. Further, the array of memory cells 212 also includes an n-th memory cell 244 having an n-th plurality of stacked memory layers 245. The n-th memory cell 244 is coupled to the signal generator 210 via a fifth switch 226 and is coupled to the sense circuitry 214 via a sixth switch 236. In a particular embodiment, each of the first plurality of switches 220, including the first, third, and fifth switches 222, 224, and 226, may be independently activated via control signals selectively applied by the controller 208 via the first lines 228. Additionally, each of the second plurality of switches 230, including the second, fourth, and sixth switches 232, 234, and 236, may be independently activated via control signals selectively applied by the controller 208 via the second lines 238.

In a particular embodiment, the host system 204 may execute a software application and may communicate with the storage device 202 to access data stored at the array of memory cells 212. The controller 208 may receive a memory access request via the interface 206 and may selectively activate at least one of the first plurality of switches 220 and at least one of the second plurality of switches 230 to selectively couple a particular memory cell, such as the first memory cell 240, to the signal generator 210 and to the sense circuitry 214. The controller 208 controls the signal generator 210 via line 216 to apply a selected signal to the selected memory cell. The sense circuitry 214 senses a tunneling resistance associated with the selected memory cell based on a received current ($I_{1\_read}$). Further, the sense circuitry 214 is adapted to determine data values stored at the first memory cell 240 based on the sensed tunneling resistance. The sense circuitry 214 can provide the determined data values to the controller 208, which may communicate data related to the determined data values to the host system 204 via the interface 206. In a particular example, the determined data values may be encrypted and the controller 208 may decrypt the data values before providing them to the host system 204. In another particular example, the determined data values may be provided directly to the host system 204.

FIG. 3A is a block diagram of a particular illustrative embodiment of an asymmetric memory location 300 of a memory cell, which may include multiple stacked memory layers. The memory location 300 includes a first electrode layer (M1) 302, a memory layer 304 that is formed from a ferroelectric (FE) material, and a second electrode layer (M2) 306. The first electrode layer (M1) 302 and the second electrode layer (M2) 306 have different screening lengths (conductances). In this example, the memory layer 304 may provide two resistive states (upward or downward polarization orientation) or three resistive states (upward, downward, or paraelectric polarization orientation), which may be used to represent data.

Figure 3B:
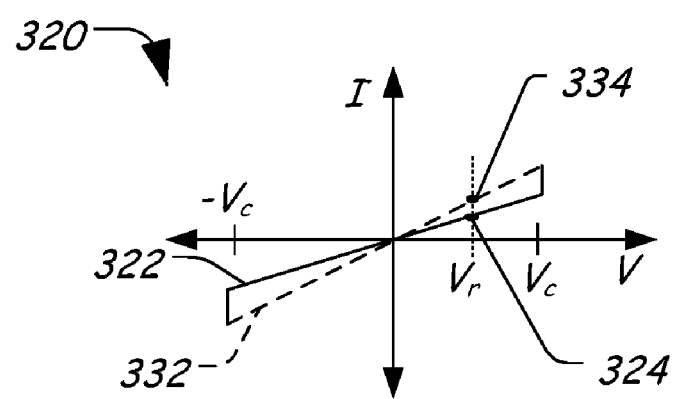
FIG. 3B is a graph of an illustrative embodiment of current versus voltage for particular data values stored at the memory location illustrated in FIG. 3A.

FIG. 3B is a graph 320 of an illustrative embodiment of current versus voltage for particular data values stored at the memory layer 304 illustrated in FIG. 3A. The graph 320 includes a first line 322 and a second line 332, which correspond to different resistance states associated with the memory location 300. For a given read back voltage (Vr), each state corresponds to a different read back current at 324 and 334. In this particular instance, the different resistance states illustrated by the first line 322 and the second line 332 relate to the different polarization orientations carried by the memory layer 304. In a particular example, the first electrode layer 302 has a higher doping concentration than the second electrode layer 306 illustrated in FIG. 3A. In a particular embodiment, the first electrode layer 302 and the second electrode layer 306 are formed from a semiconductor material, which has a selected doping concentration to control their respective conductances. If the memory layer 304 carries a polarization orientation in an upward direction, an applied read voltage (Vr) would result in a current level indicated at 324. In contrast, if the memory layer 304 has a polarization orientation in a downward direction, the applied read voltage (Vr) would result in a current level indicated at 334. The graph 320 also includes a critical voltage (Vc) and a negative critical voltage (−Vc) at which the polarization orientation of the memory layer 304 is changed.

Figure 4A:
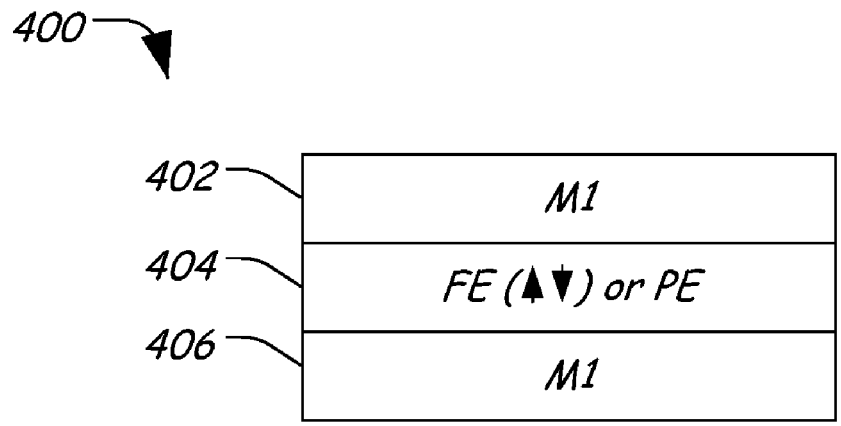
FIG. 4A is a block diagram of a second particular illustrative embodiment of a memory location of a memory cell, which may include multiple stacked memory layers.

FIG. 4A is a block diagram of a second particular illustrative embodiment of a symmetric memory location 400 of a memory cell, which may include multiple stacked memory layers. The memory location 400 includes a first electrode layer (M1) 402, a memory layer 404 that is formed from a ferroelectric (FE) material, and a second electrode layer (M1) 406. In this example, the memory layer 404 may be used to provide two resistive states (upward/downward polarization orientation or paraelectric orientation). In this example, the first electrode layer (M1) 402 and the second electrode layer (M1) 406 have substantially equal screening lengths (conductances). Since the memory location 400 is symmetric, an upward or a downward polarization would result in a substantially equal tunneling resistance, while a paraelectric orientation would have a substantially different tunneling resistance.

Figure 4B:
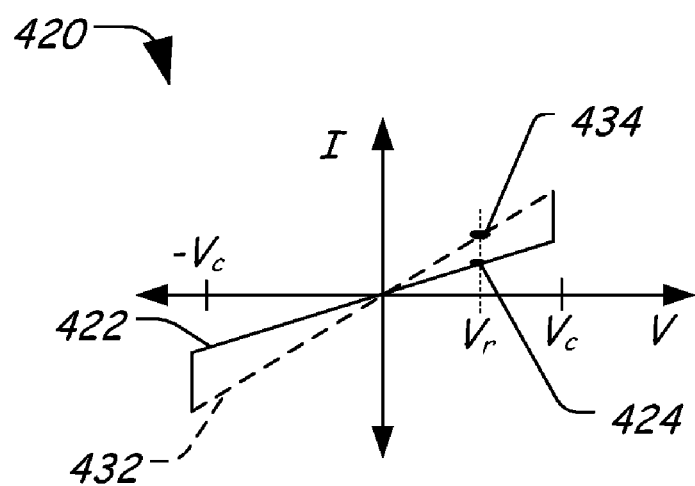
FIG. 4B is a graph of an illustrative embodiment of current versus voltage for particular data values stored at the memory layer illustrated in FIG. 4A.

FIG. 4B is a graph 420 of an illustrative embodiment of current versus voltage for particular data values stored at the memory layer 404 illustrated in FIG. 4A. The graph 420 includes a first line 422 and a second line 432, which correspond to different resistance states associated with the memory location 400. For a given read back voltage (Vr), each state corresponds to a different read back current at 424 and 434. In this particular instance, the different resistance states illustrated by the first line 422 and the second line 432 correspond to either an up or down polarization orientation or a paraelectric (depolarization) orientation, respectively. The graph 420 also includes a critical voltage (Vc) and a negative critical voltage (−Vc) at which the polarization orientation of the memory layer 404 is changed.

FIG. 5A is a block diagram of a third particular illustrative embodiment of a memory location 500 of a memory cell, which may include multiple stacked memory layers. The memory location 500 includes a first electrode layer (M1) 502, a memory layer 504 that is formed from a ferroelectric (FE) material, and a second electrode layer (M2) 506. In this example, the first electrode layer (M1) 502 and the second electrode layer (M2) 506 have different screening lengths (conductances). Because the first and second electrode layers 502 and 506 have different conductances, the memory location 500 may be used to provide up to three resistive states relative to the orientation of the electric field carried by the memory layer 504 (upward, downward, or paraelectric polarization orientation).

Figure 5B:
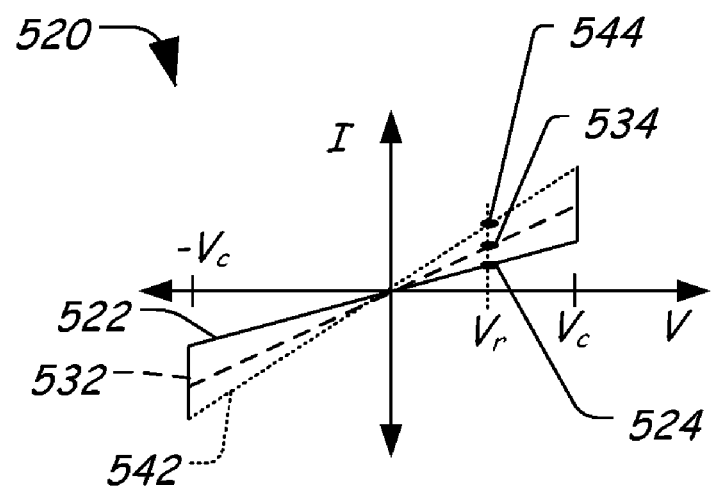
FIG. 5B is a graph of an illustrative embodiment of current versus voltage for particular data values stored at the memory layer illustrated in FIG. 5A.

FIG. 5B is a graph 520 of an illustrative embodiment of current versus voltage for particular data values stored at the memory layer 504 illustrated in FIG. 5A. The graph 520 includes a first line 522, a second line 532, and a third line 534, which correspond to different resistance states related to the polarization orientation associated with the memory location 500. For a given read back voltage (Vr), each polarization orientation state corresponds to a different read back current at 524, 534, and 534. In this particular instance, the different resistance states illustrated by the first line 522, the second line 532, and the third line 542 have slopes that correspond to the tunneling resistance associated with the different polarization orientations carried by the memory layer 504.

In a particular example, the first electrode layer 502 has a higher doping concentration than the second electrode layer 506 illustrated in FIG. 5A. If the memory layer 504 carries a polarization orientation in an upward direction, an applied read voltage (Vr) would result in a current level indicated at 524. In contrast, if the memory layer 504 has a polarization orientation in a downward direction, the applied read voltage (Vr) would result in a current level indicated at 534. If the memory layer 504 carries a paraelectric polarization orientation, the applied read voltage (Vr) would result in a current level indicated at 544. The graph 520 also includes a critical voltage (Vc) and a negative critical voltage (-Vc) at which the polarization orientation of the memory layer 504 is changed.

In general, it should be understood that the electrode layers illustrated in FIGS. 3A, 4A, and 5A may be formed from any conductor or doped semiconductor material. By making the electrodes out of different electrode material, two different electrode/memory layer interfaces are formed, which have different tunneling resistances based on the polarization orientation.

In a particular embodiment, the memory cells 300, 400, and 500 illustrated in FIGS. 3A, 4A, and 5A may be formed on a semiconductor substrate by depositing a bottom electrode material, such as Strontium-di-Ruthenium-tri-Oxide ($SrRu_2O_3$) that can be used to seed the ferroelectric layer. In another particular embodiment, an insulator layer can be deposited between the ferroelectric memory layer and one of the electrodes to form an asymmetric memory cell.

Figure 6A:
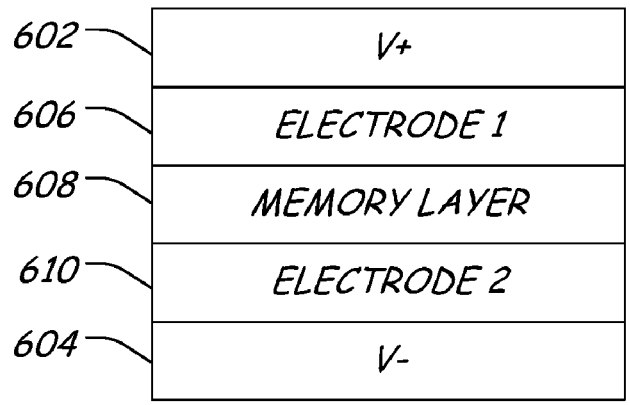
FIG. 6A is a block diagram of a fourth particular embodiment of a memory location of a memory cell, which may have multiple stacked memory layers.

FIG. 6A is a block diagram of a fourth particular embodiment of a memory location 600 of a memory cell, which may include multiple stacked memory locations including an asymmetric memory location. The memory location 600 includes a first external electrode 602 and a second external electrode 604. The memory location 600 also includes a first internal electrode 606 coupled to the first external electrode 602, a second internal electrode 610 coupled to the second external electrode 604, and a memory layer 608 sandwiched between the first and second internal electrodes 606 and 610.

In a particular illustrative embodiment, the first internal electrode 606 and the second internal electrode 610 are formed from the same material and have the same composition, such that the memory location 600 has a bi-stable junction (i.e., an upward or downward polarization in a first state or paraelectric polarization in a second state). In another particular embodiment, the first internal electrode 606 and the second internal electrode 610 are formed from different materials or from the same material with different compositions, such that the memory location 600 has a tri-stable junction (i.e., an upward polarization orientation, a downward polarization orientation, or a paraelectric (de-polarized) polarization orientation), which is adapted to represent three different stored values as three different tunneling resistances.

Figure 6B:
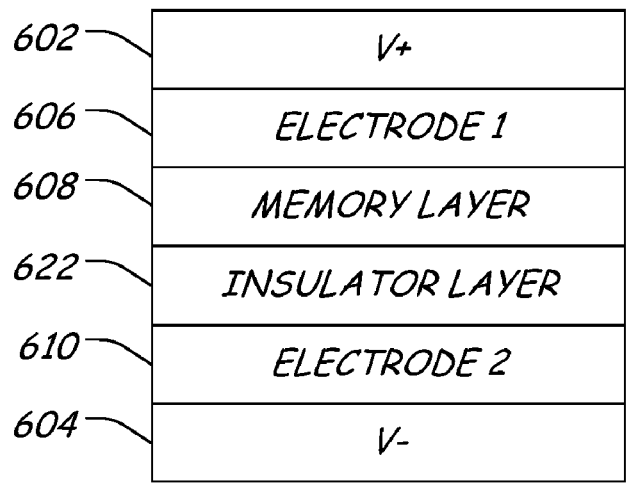
FIG. 6B is a block diagram of a fifth particular embodiment of a memory location of a memory cell, which may include multiple stacked memory layers.

FIG. 6B is a block diagram of a fifth particular embodiment of a memory location 600 within a memory cell, which may include multiple stacked memory layers. The memory location 600 includes a first external electrode 602 and a second external electrode 604. The memory location 600 also includes a first internal electrode 604 coupled to the first external electrode 602, a second internal electrode 610 coupled to the second external electrode 604, and an insulator layer 622 coupled to the second electrode 610. The memory location 600 further includes a memory layer 608 that is sandwiched between the first internal electrode 606 and the insulator layer 622.

In a particular embodiment, the first and second internal electrodes 606 and 610 may be formed from the same material, and the presence of the insulator layer 622 turns the memory layer 604 into an asymmetric memory cell. The insulator layer 622 separates the second internal electrode 610 from the memory layer 608, increasing a tunneling resistance across the memory location 600. In a particular embodiment, the insulator layer 622 may be formed from a electrically insulating material.

In general, a memory cell may include multiple stacked memory layers, such as the memory layers 304, 404, 504, and 604 illustrated and described with respect to FIGS. 3A-6B, to store multiple data values. In a particular embodiment, a memory device may include multiple memory cells, where each memory cell includes multiple stacked memory layers. Data may be written to or read from the memory device in data blocks, such that multiple memory cells are written to and read from substantially concurrently.

Figure 7A:
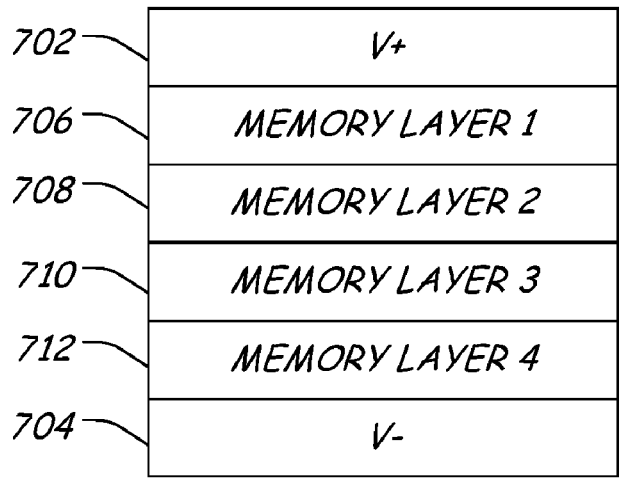
FIG. 7A is a block diagram of a particular illustrative embodiment of a memory cell including multiple stacked memory layers with different hysteretic properties.

FIG. 7A is a block diagram of a particular illustrative embodiment of a memory cell 700 including multiple stacked memory layers. The memory cell 700 includes a first external electrode 702 and a second external electrode 704, which may be coupled to a signal generator (such as the signal generator 210 illustrated in FIG. 2) to receive an applied signal. The multiple stacked memory layers include a first memory layer 706, a second memory layer 708, a third memory layer 710, and a fourth memory layer 712, which are sandwiched between the first and second external electrodes 702 and 704.

In a particular embodiment, each of the memory layers 706, 708, 710, and 712 has a unique configuration, such that each of the memory layers 706, 708, 710 and 712 has a unique tunneling resistance that can be sensed to determine a stored value at a particular memory layer based on a tunneling resistance of the entire memory cell 700.

Figure 7B:
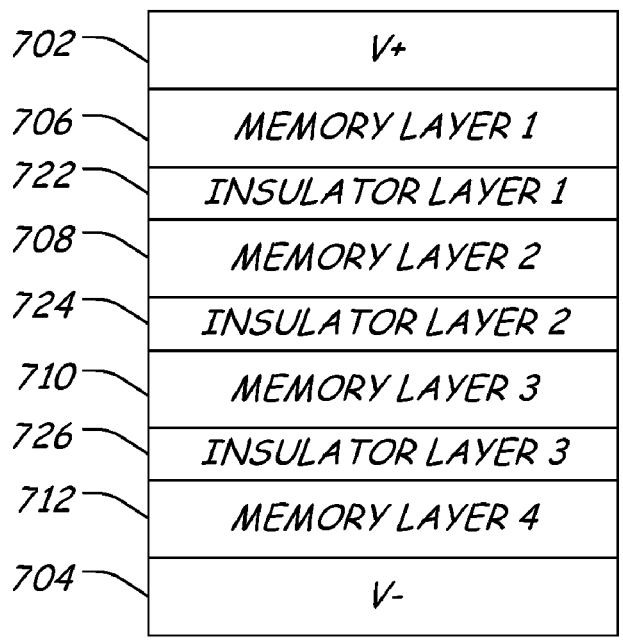
FIG. 7B is a block diagram of a second particular illustrative embodiment of a memory cell including multiple stacked memory layers separated by insulator layers.

FIG. 7B is a block diagram of a second particular illustrative embodiment of a memory cell 720 including multiple stacked memory layers separated by insulator layers. The memory cell 720 includes a first external electrode 702 and a second external electrode 704, which may be coupled to a signal generator to receive an applied signal. The multiple stacked memory layers include a first memory layer 706, a first insulator layer 722, a second memory layer 708, a second insulator layer 724, a third memory layer 710, a third insulator layer 726, and a fourth memory layer 712, which are sandwiched between the first and second external electrodes 702 and 704.

In a particular embodiment, the first, second, and third insulator layers 722, 724, and 726 may be formed from different materials, may have different doping concentrations, may have different thicknesses, or any combination thereof. In this example, if the first, second, third, and fourth memory layers 706, 708, 710, and 712 are formed from the same material, the first, second, and third insulator layers 722, 724, and 726 can be used to define unique tunneling resistances, which may be used to determine a data value stored at a particular memory location, such as a data value stored at the second memory layer 708 based on a tunneling resistance of the entire memory cell 720.

Figure 7C:
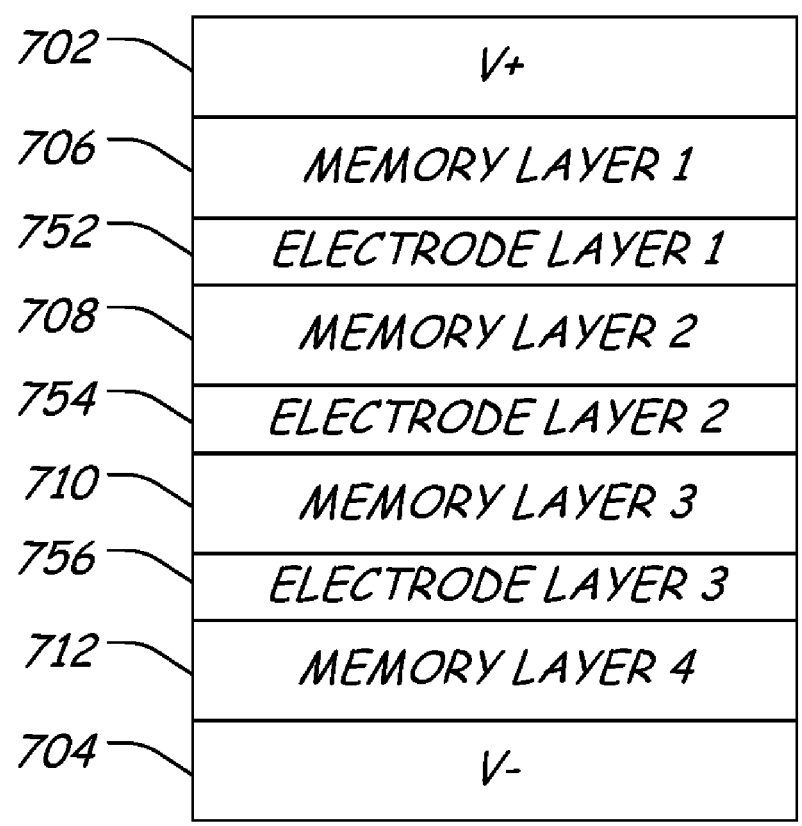
FIG. 7C is a block diagram of a third particular illustrative embodiment of a memory cell including multiple stacked memory layers separated by internal electrodes.

FIG. 7C is a block diagram of a third particular illustrative embodiment of a memory cell 750 including multiple stacked memory layers. The memory cell 750 includes a first external electrode 702 and a second external electrode 704, which may be coupled to a signal generator to receive an applied signal. The multiple stacked memory layers include a first memory layer 706, a first internal electrode layer 752, a second memory layer 708, a second internal electrode layer 754, a third memory layer 710, a third internal electrode layer 756, and a fourth memory layer 712, which are sandwiched between the first and second external electrodes 702 and 704.

In a particular embodiment, the first, second, and third internal electrode layers 752, 754, and 756 may be formed from different materials, may have different doping concentrations, may have different thicknesses, or any combination thereof. In this example, if the first, second, third, and fourth memory layers 706, 708, 710, and 712 are formed from the same material, the first, second, and third internal electrode layers 752, 754, and 756 can be used to define unique tunneling resistances, which may be used to determine a data value stored at a particular memory location, such as a data value stored at the second memory layer 708 based on a tunneling resistance of the entire memory cell 750.

In a particular example, the first and second external electrodes 702 and 704 and the first, second, and third internal electrodes 752, 754, and 756 can be conductors or semiconductors. The particular material used to form the first, second, and third internal electrodes 752, 754, and 756 can be selected to allow continued epitaxial growth between the memory layers 706, 708, 710 and 712. Such epitaxial growth may be controlled to enhance the change in resistance for the adjacent memory layers, such as the first and second memory layers 706 and 708, the second and third memory layers 708 and 710, and the third and fourth memory layers 710 and 712, for example. Further, the particular material used to form the first, second, and third internal electrodes 752, 754, and 756 may allow continued epitaxial growth to change the properties of subsequent layers to adjust their change in resistance due to changes in polarization orientation and to adjust the critical voltage (Vc) of each respective layer. The critical voltage (Vc) is the voltage at which a particular layer changes its tunneling resistance.

In a particular embodiment, the interfaces between the first, second, third and fourth memory layers 706, 708, 710, and 712 and the first, second and third internal electrodes 752, 754, and 756 may vary in resistance by as much as three (3) times a tunneling resistance value. This difference may be exploited by using different internal electrodes or by inserting a non-ferroelectric oxide between one end of a memory layer, such as the first memory layer 706, and the adjacent electrode, such as the first internal electrode 752. Such internal electrodes, including the first, second, and third internal electrodes 752, 754, and 756 can also allow for conduction via a series of tunneling events across a series of thin memory layers, instead of requiring that the electrons tunnel across the entire memory element stack, where there are competing transport mechanisms, including Schottky thermionic emission, Poole-Frenkel conduction, Fowler-Nordheim tunneling, other transport mechanisms, or any combination thereof.

In a particular embodiment, the memory cell 750 includes a plurality of electrode layers 702, 704, 752, 754, and 756 that are associated with the plurality of memory layers 706, 708, 710, and 712, wherein each memory layer 706, 708, 710 and 712 is separated from an adjacent memory layer by an electrode layer of the plurality of electrode layers 752, 754 and 756. In a particular example, the plurality of electrode layers 702, 704, 752, 754 and 756 may be symmetric or asymmetric.

Figure 8:
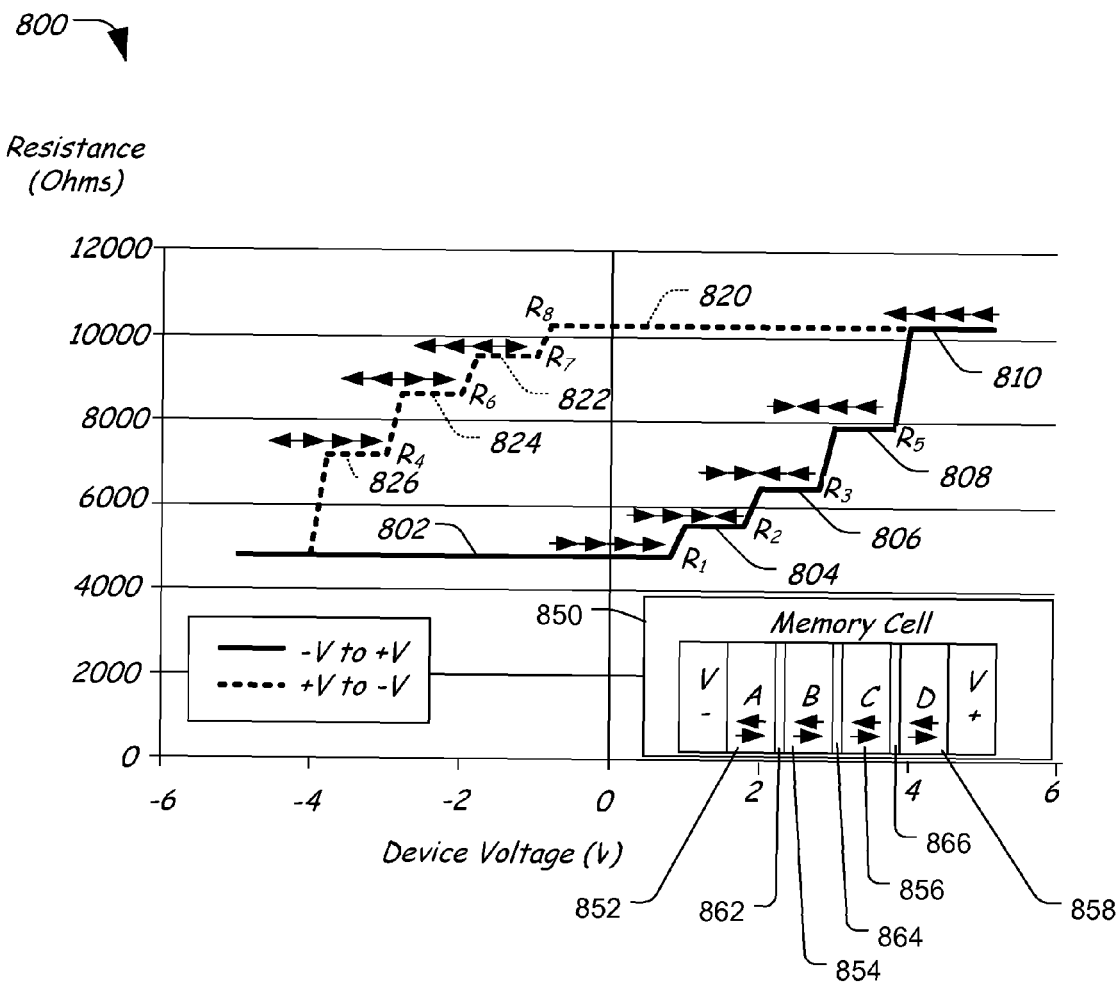
FIG. 8 is a graph of a particular illustrative embodiment of a transfer curve (Resistance versus Device Voltage) for a memory cell including four stacked memory layers with different hysteretic properties.

FIG. 8 is a graph 800 of a particular illustrative embodiment of a transfer curve (Resistance in ohms versus device voltage in volts) for a memory cell 850 illustrated in the inset. The memory cell 850 includes four stacked memory layers (A, B, C, and D) 852, 854, 856, and 858, which are separated by electrode layers 862, 864, and 866. For illustrative purposes, it is assumed that the critical voltage (Vc) of the memory layer (A) 852 (i.e., Vc_A) is the critical voltage that needs to be applied to make the memory layer (A) 852 either switch its polarization orientation right (−Vc_A) or left (+Vc_A). In general, it is assumed that the positive and negative switching voltages have the same magnitude and that the magnitudes of the critical voltage for the first memory layer (A) 852 (Vc_A) is greater than the critical voltage of the second memory layer (B) 854 (Vc_B), which in turn is greater than the critical voltage of the third memory layer (C) 856 (Vc_C) and which is greater than the critical voltage of the fourth memory layer (D) 858 (Vc_D) (i.e., Vc_A>Vc_B>Vc_C>Vc_D). A change in resistance (ΔR) for the first memory layer (A) 852 (ΔR_A) represents when the first memory layer (A) 852 changes its polarization orientation from pointing to the right to pointing to the left. It is assumed that the change in resistance of the first memory layer (A) 852 (ΔR_A) is greater than the change in resistance of the second memory layer (B) 854 (ΔR_B), which is greater than the change in resistance of the third memory layer (C) 856 (ΔR_C) and which is greater than the change in resistance of the fourth memory layer (D) 858 (ΔR_D) (i.e., ΔR_A>ΔR_B>ΔR_C>ΔR_D). It is further assumed that the memory layers are in their high resistance state when they are pointing to the left, as indicated at 810. Further, a third resistance state for each junction can be added by depolarizing the memory layers 852, 854, 856, and 858.

Referring again to FIG. 8, the following description takes the memory cell 850 through a complete transfer curve. Applying a large negative voltage (−V>Vc_A) causes the polarization orientation of all of the memory layers 852, 854, 856, and 858 to point to the right, as illustrated at 802. This is assumed to be the lowest resistance state (R1) for the memory cell 850. The level of this resistance state (R1) is determined by the type of material used to form the memory layers 852, 854, 856, and 858 and by the materials used to form the internal electrode layers 862, 864, and 866. If the applied voltage is reduced to zero volts, the memory cell 850 will have a resistance (R1) illustrated at 802, and the memory cell 850 will remain in a stable resistance state.

If an applied voltage ($V_{applied}$) is less than a critical voltage associated with the memory layer 856 (Vc_C) and greater than a critical voltage associated with the memory layer 858 (Vc_D), the polarization orientation of the memory layer (D) 858 will be changed to point to the left, but the remaining layers will maintain their orientations. The alteration of the polarization of the memory layer (D) 858 increases the tunneling resistance of the memory cell 850 from R1 to R2, indicated at 804 (i.e., R2=R1+ΔR_D). If the applied voltage ($V_{applied}$) returns to zero volts, the memory cell 850 has a resistance (R2) generally indicated at 804, which is a stable resistance state.

If an applied voltage ($V_{applied}$) is less than a critical voltage associated with the memory layer (B) 854 (Vc_B) and greater than a critical voltage associated with the memory layer (C) 856 (Vc_C), the polarization orientation of the memory layer (C) 856 will be changed to point to the left, but the remaining layers will maintain their orientations. The alteration of the polarization of the memory layer (C) 856 increases the tunneling resistance of the memory cell 850 from R2 to R3, indicated at 806 (i.e., R3=R1+ΔR_D+ΔR_C). If the applied voltage ($V_{applied}$) returns to zero volts, the memory cell 850 has a resistance (R3) generally indicated at 806, which is a stable resistance state.

If an applied voltage ($V_{applied}$) is less than a critical voltage associated with the memory layer (A) 852 (Vc_A) and greater than a critical voltage associated with the memory layer (B) 854 (Vc_B), the polarization orientation of the memory layer (B) 854 will be changed to point to the left, but the remaining layers will maintain their orientations. The alteration of the polarization of the memory layer (B) 854 increases the tunneling resistance of the memory cell 850 from R3 to R5, indicated at 808 (i.e., R5=R1+ΔR_D+ΔR_C+ΔR_B). If the applied voltage ($V_{applied}$) returns to zero volts, the memory cell 850 has a resistance (R5) generally indicated at 808, which is a stable resistance state.

If an applied voltage ($V_{applied}$) is greater than a critical voltage associated with the memory layer (A) 852 (Vc_A), the polarization orientation of the memory layer (A) 852 will be changed to point to the left, but the remaining layers will maintain their orientations. The alteration of the polarization of the memory layer (A) 852 increases the tunneling resistance of the memory cell 850 from R5 to R8, indicated at 810 (i.e., R8=R1+ΔR_D+ΔR_C+ΔR_B+ΔR_A). If the applied voltage ($V_{applied}$) returns to zero volts, the memory cell 850 has a resistance (R8) generally indicated at 810, which is a stable resistance state. The polarization of all of the memory layers 852, 854, 856, and 858 to the left represents a highest resistance state for the memory cell 850 and completes the right side portion of the transfer curve illustrated in the graph 800.

If a magnitude of a negative applied voltage (−$V_{applied}$) is less than a critical voltage of the memory layer (C) 856 (Vc_C) and greater than a critical voltage of the memory layer (D) 858 (Vc_D), the polarization orientation of the memory layer (D) 858 will be changed to point to the right, but the remaining layers will maintain their orientations. The alteration of the polarization of the memory layer (D) 858 decreases the tunneling resistance of the memory cell 850 from R8 to R7, indicated at 822 (i.e., R7=R8−ΔR_D). If the applied voltage ($V_{applied}$) returns to zero volts, the memory cell 850 has a resistance (R7) generally indicated at 822, which is a stable resistance state.

If a magnitude of a negative applied voltage (−$V_{applied}$) is less than a critical voltage of the memory layer (B) 854 (Vc_B) and greater than a critical voltage of the memory layer (C) 856 (Vc_C), the polarization orientation of the memory layer (C) 856 will be changed to point to the right, but the remaining layers will maintain their orientations. The alteration of the polarization of the memory layer (C) 856 decreases the tunneling resistance of the memory cell 850 from R7 to R6, indicated at 824 (i.e., R6=R8−ΔR_D−ΔR_C). If the applied voltage ($V_{applied}$) returns to zero volts, the memory cell 850 has a resistance (R6) generally indicated at 824, which is a stable resistance state.

If a magnitude of a negative applied voltage (−$V_{applied}$) is less than a critical voltage of the memory layer (A) 852 (Vc_A) and greater than a critical voltage of the memory layer (B) 854 (Vc_B), the polarization orientation of the memory layer (B) 854 will be changed to point to the right, but the remaining layers will maintain their orientations. The alteration of the polarization of the memory layer (B) 854 decreases the tunneling resistance of the memory cell 850 from R6 to R4, indicated at 826 (i.e., R4=R8−ΔR_D−ΔR_C−ΔR_B). If the applied voltage ($V_{applied}$) returns to zero volts, the memory cell 850 has a resistance (R4) generally indicated at 826, which is a stable resistance state.

If a magnitude of a negative applied voltage (−$V_{applied}$) is greater than a critical voltage of the memory layer (A) 852 (Vc_A), the polarization orientation of the memory layer (A) 852 will be changed to point to the right, but the remaining layers will maintain their orientations. The alteration of the polarization of the memory layer (A) 852 decreases the tunneling resistance of the memory cell 850 from R4 to R1, indicated at 802 (i.e., R1=R8−ΔR_D−ΔR_C−ΔR_B−ΔR_A). If the applied voltage ($V_{applied}$) returns to zero volts, the memory cell 850 has a resistance (R1) generally indicated at 802, which is a stable resistance state. At this state, the polarization orientation of all of the memory layers 852, 854, 856, and 858 are pointing to the right, which is the lowest resistance state for the memory cell 850 and which completes the left side of the transfer curve.

In general, the above-description identified 2N states, where N represents a number of memory cell layers (i.e., memory layers 852, 854, 856, and 858). To achieve 2N states (i.e., 2N tunneling resistances levels), the memory layer resistance values can be chosen appropriately to provide no degenerate states. In a particular example, a pre-read operation may be performed before writing. In another particular example, blocks of data can be written concurrently. In this example, the values stored at the memory layers (i.e., the polarization orientation) may be reset before a write voltage is applied. Such a reset operation may include applying a large positive or negative voltage to polarize the various memory layers 852, 854, 856, and 858 in a particular direction. In this instance, the write voltage can be a single voltage value to alter a polarization orientation at a single memory layer, such as the memory layer 856, while the states of the other memory layers 852, 854, and 858 are maintained. In another particular example, a pre-read operation could be performed to determine a state of the memory cell 850, and one or more selected voltages may be applied in a sequence to reach a desired state, for example, by altering a polarization orientation of selected memory layers of the memory cell 850.

It should be understood that additional states can be achieved if minor loops are allowed or if depolarization of the FE is allowed (i.e., if paraelectric or depolarized states are allowed). In a particular illustrative example, if the following voltage sequence is applied to the memory cell 850, it would result in a memory state at the memory cell 850 that is additional to the eight states illustrated in FIG. 8 and described in the example above. For example, a first applied voltage ($V_{applied}$) is applied to the memory cell 850 that is greater than the critical voltage of the memory layer (A) 852 (Vc_A), changing an orientation of the memory layer (A) 852. A second applied voltage that is a negative voltage (−$V_{applied}$) is applied to the memory cell 850 that has a magnitude that is less than a critical voltage of the memory layer (A) 852 and greater than a critical voltage of the memory layer (B) 854 (i.e., Vc_A>−$V_{applied}$>Vc_B), changing a polarization orientation of the memory layer (B) 854. A third applied voltage is applied that is greater than a critical voltage of the memory layer (D) 858 (Vc_D), changing a polarization orientation of the memory layer (D) 858. In this example, the resulting state of the memory cell 850 would have a tunneling resistance that falls between the resistances R4 and R5.

In general, a number of states that can be achieved for a given number of memory layers can depend on controllability of the changes in resistance (ΔR). If a sufficient number of non-degenerate resistance states can be achieved and if the applied voltage is controlled to provide multiple different voltage pulses, a large number of tunneling resistance levels can be achieved, such as $X^N$ resistance levels, where N represents the number of memory layers of the memory cell. In this example, the variable (X) is equal to two (2) if only two different resistance states are achievable per memory layer, and is equal to three (3) if three different resistance states are achievable. For example, the variable (X) is equal to three (3) when a different resistance state is reached for each polarization orientation and for the paraelectric or depolarized state.

In a particular example, an entire 8 bits ($2^8$=256 states) could be stored at a single memory cell having 8 layers, where a high resistance state corresponds to a "1" value and a low resistance state corresponds to a "0" value. A particularly complex state may be represented as "01010101," where the left-most zero is stored at a first memory layer, such as the memory layer (A) 852, and the right-most "1" is stored at a memory layer "H" (not shown). In this example, the critical voltages for the memory layers A-H of a particular memory cell would be as follows:

$$Vc\_A > Vc\_B > Vc\_C > Vc\_D > Vc\_E > Vc\_F > Vc\_G > Vc\_H.$$

This particular state can be written to a memory cell having eight (8) memory layers by applying eight (8) applied voltages at selected voltage levels in the following order:

1. -Vapplied>Vc_A;
2. Vc_B<Vapplied<Vc_A;
3. Vc_C<-Vapplied<Vc_B;
4. Vc_D<Vapplied<Vc_C;
5. Vc_E<-Vapplied<Vc_D;
6. Vc_F<Vapplied<Vc_E;
7. Vc_G<-Vapplied<Vc_F;
8. Vapplied>Vc_H.

Using this same exemplary memory cell having eight memory layers, the number of available resistance states can be increased to $3^8$=6561 memory states by using the paraelectric or depolarized state.

Further, additional states can be reached if multiple polarization states for each polarization direction can be achieved. For example, if the level of polarization and if partial polarization can be achieved and can be maintained as a stable state, then five polarization states (polarized up, partial polarized up, paraelectric, partial polarized down, and polarized down) would be possible for each polarization orientation, resulting in $5^N$ possible memory states, where N represents a number of memory layers.

In general, a critical voltage for each memory layer of a memory cell can be controlled by parameters such as the memory layer material, the memory layer composition, the memory layer thickness, and material properties associated with adjacent materials. Further, the critical voltages can be controlled by the thickness and type of interlayer materials, such as the internal electrode material, insulator layer material, or any combination thereof.

In general, the memory cell 850, illustrated in FIG. 8, and the memory cells described with respect to FIGS. 1-7 were largely explained in light of ferroelectric (FE) memory layer materials. However, other types of material may be used to form the memory layers, including phase change material, resistive oxide material, charge trap material, other materials, or any combination thereof. Further, the "depolarizing" approach may be used for materials such as the charge trap material, yielding an intermediate charge trap state, which may provide a detectably unique tunneling resistance.

Further, the above-description was largely directed to a solid-state type of memory device; however, the multiple state memory call can also be used with rotating or probe-type storage devices, where the recording is performed using read/write head contact or pseudo-contact or may be used with a storage device including a conductive media between the read/write head and the storage media. The storage media in both the rotating or probe cases could be continuous or patterned.

Figure 9:
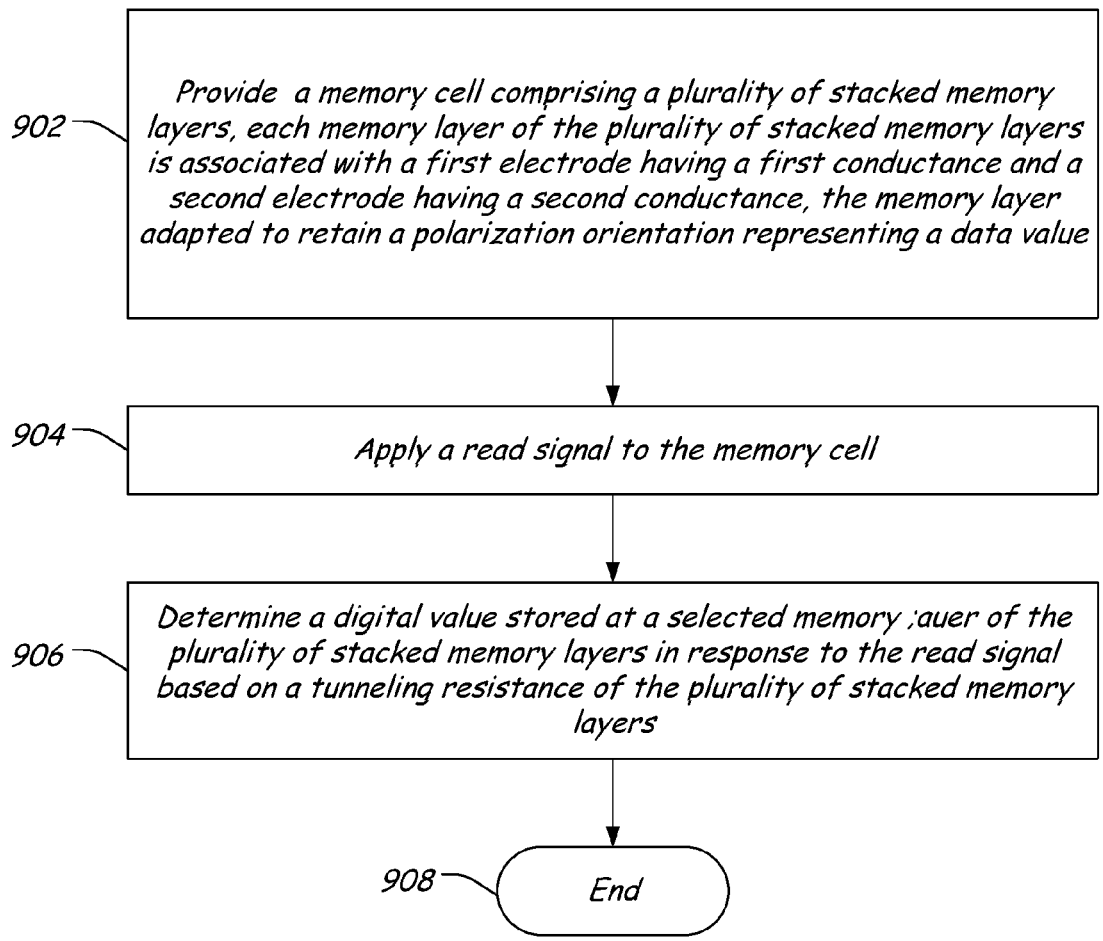
FIG. 9 is a flow diagram of a particular illustrative embodiment of a method of accessing data stored at a memory layer within a memory cell including multiple stacked memory layers with different hysteretic properties.

FIG. 9 is a flow diagram of a particular illustrative embodiment of a method of accessing data stored at a memory location within a memory cell including multiple stacked memory layers. At 902, a memory cell is provided that includes a plurality of stacked memory layers, where each memory layer of the plurality of stacked memory layers is associated with a first electrode having a first conductance and a second electrode having a second conductance. The memory layer is adapted to retain a polarization orientation representing a data value. In a particular embodiment, the memory layer is a ferroelectric, phase change, charge trap, or other non-magnetic material. In a particular embodiment, each memory layer of the plurality of stacked memory layers has an independent polarization orientation state, which may be changed via application of a unique applied voltage that is within a selected voltage range. In another particular embodiment, each of the plurality of stacked memory layers is associated with an insulator layer disposed between the second electrode and the non-magnetic memory layer. In still another particular embodiment, the plurality of stacked memory layers includes a first memory layer having a first thickness and includes a second memory layer having a second thickness. The first and second memory layers have different tunneling resistances.

Proceeding to 904, a read signal is applied to the memory cell. Continuing to 906, a digital value stored at a selected memory location of the plurality of stacked memory layers is determined based on a tunneling resistance of the plurality of stacked memory layers in response to the read signal. The method terminates at 908.

In a particular example, a memory layer of the plurality of stacked memory layers has a polarization orientation that represents a first polarization state, a second polarization state, or a paraelectric or depolarized state, and wherein the first polarization state, the second polarization state, and the paraelectric state have different tunneling resistances representing different data values.

In another particular example, the method further includes applying a write signal to at least one of the plurality of stacked memory layers including a particular memory location. The write signal alters a tunneling resistance associated with the at least one memory layer. In still another particular embodiment, the plurality of stacked memory layers includes a respective plurality of internal electrodes, insulator layers, or any combination thereof.

Figure 10:
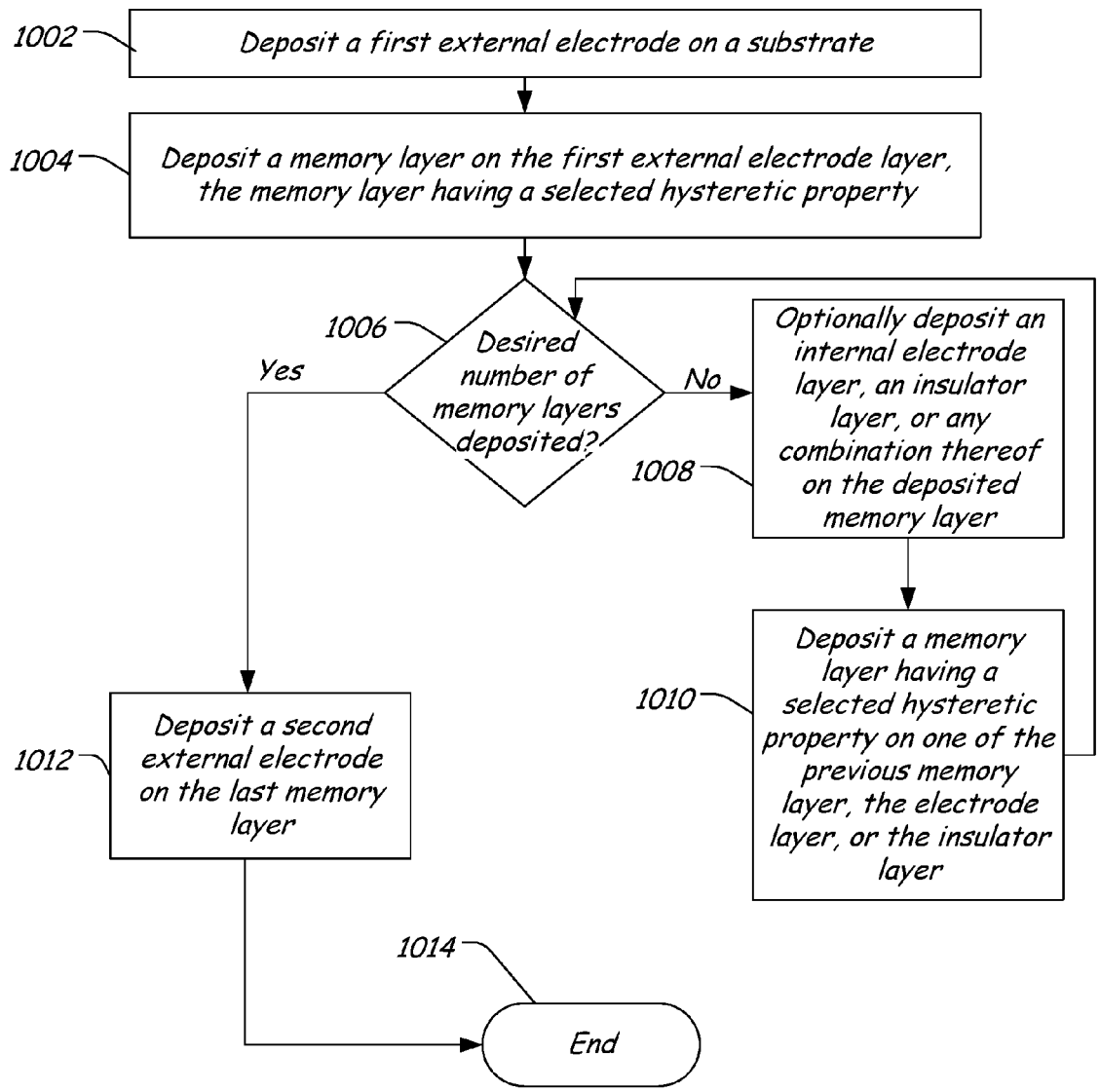
FIG. 10 is a flow diagram of a particular illustrative embodiment of a method of manufacturing a memory cell including multiple stacked memory layers with different hysteretic properties.

FIG. 10 is a flow diagram of a particular illustrative embodiment of a method of manufacturing a memory cell including multiple stacked memory layers with different hysteretic properties. At 1002, a first external electrode is deposited on a substrate. In a particular example, the first external electrode may be deposited within a trench formed on the substrate. Moving to 1004, a memory layer is deposited on the first external electrode layer, where the memory layer has a selected hysteretic property. In a particular example, the hysteretic property includes a ferroelectric property that allows the memory layer to carry an electrical field in two or more states. Continuing to 1006, the method includes determining whether a desired number of memory layers have been deposited. If not, the method advances to 1008 and an internal electrode layer, an insulator layer, or any combination thereof is optionally deposited on the deposited memory layer. Proceeding to 1010, another memory layer having a selected hysteretic property is deposited on one of the previous memory layer, the electrode layer, or the insulator layer. The method returns to 1006 to determine whether a desired number of memory layers have been deposited.

Returning to 1006, if a desired number of memory layers have been deposited, the method continues to 1012 and a second external electrode is deposited on the last memory layer. The first and second external electrodes may include or may be coupled to bonding pads to couple to external circuitry, such as a control circuit. The method terminates at 1014.

In a particular example, the method involves depositing multiple memory layers, which may have different compositions, different doping concentrations, different thicknesses, or any combination thereof. In a particular example, the memory layers may be deposited symmetrically, and the deposited internal electrode layers or the internal insulator layers may be deposited asymmetrically to produce a unique tunneling resistance at each memory layer. In a particular example, the internal electrode layers may be formed from semiconductor material having different doping concentrations, such that each electrode layer has a unique conductance relative to the other electrode layers.

It should be understood that the method outlined with respect to FIG. 10 may include additional steps, such as photo-lithography steps including applying a mask layer, performing a photolithography process or otherwise etching the stack of memory layers to a desired profile. Other steps may also be included. However, such steps are well known in the art and are omitted here to simplify the discussion.

In general, while the above-discussion has focused on reading and writing data values to a memory layer within a stack of memory layers, it should be understood that the general concept can be extended to blocks of data. In particular, a bank of memory cells may be accessed substantially concurrently to read or write a block of data to the memory device.

Although the present invention has been described with reference to preferred embodiments, workers skilled in the art will recognize that changes may be made in form and detail without departing from the spirit and scope of the invention.

What is claimed is:

1. A storage device comprising:
   a controller; and
   a plurality of resistive elementary memory cells accessible via the controller, each resistive elementary memory cell of the plurality of resistive elementary memory cells including a plurality of memory layers, wherein each of the plurality of memory layers has a different critical voltage for changing a polarization of the memory layer.

2. The storage device of claim 1, wherein the plurality of memory layers has different critical voltages because of different hysteretic properties of the memory layers.

3. The storage device of claim 1, further comprising a plurality of electrode layers associated with the plurality of memory layers, wherein each memory layer of the plurality of memory layers is separated from an adjacent memory layer by an electrode layer of the plurality of electrode layers.

4. The storage device of claim 3, wherein the plurality of electrode layers comprises symmetric electrode layers.

5. The storage device of claim 3, wherein the plurality of electrode layers comprises asymmetric electrode layers, and the asymmetric electrode layers provide the different critical voltages of the memory layers.

6. The storage device of claim 1, wherein a selected resistive elementary memory cell of the plurality of resistive elementary memory cells stores multiple data values that are represented by a unique tunneling resistance.

7. The storage device of claim 6, wherein the controller is adapted to apply a unique write signal to the selected resistive elementary memory cell to alter the unique tunneling resistance to represent different data values.

8. The storage device of claim 1, wherein the plurality of memory layers comprises non-magnetic memory layers.

9. The storage device of claim 1, wherein the plurality of memory layers are selected to have a hysteretic property including a spontaneous polarization property.

10. A memory device comprising:
    a first electrode;
    a second electrode;
    multiple memory layers between the first and second electrodes to store multiple data values, each memory layer of the multiple memory layers having a unique hysteretic property to store a data value of the multiple data values; ; and
    a controller coupled to the multiple memory layers via at least one of the first and second electrodes, the controller to read the multiple data values from the multiple memory layers without altering the multiple data values.

11. The memory device of claim 10, wherein the multiple memory layers comprise ferroelectric layers adapted to carry independent polarized electrical fields to induce electron charge distributions representing unique data values.

12. The memory device of claim 10, wherein the multiple memory layers comprise phase change media layers having hysteretic properties that can be independently configured to represent unique data values.

13. The memory device of claim 10, wherein the multiple memory layers comprise charge trap layers to trap electrical charges, the charge trap layers configurable to induce an electron charge distribution to represent unique data values.

14. The memory device of claim 10, wherein the multiple data values are represented by a unique tunneling resistance through the multiple memory layers.

15. The memory device of claim 10, further comprising multiple internal electrodes corresponding to the multiple memory layers, wherein adjacent memory layers of the multiple memory layers are separated by an internal electrode of the multiple internal electrodes.

16. The memory device of claim 15, further comprising multiple insulator layers corresponding to the multiple internal electrodes, wherein a multiple insulator layer of the multiple insulator layers separates the internal electrode from a memory layer of the adjacent memory layers.

17. A memory device comprising:
    a plurality of resistive memory cells, each resistive memory cell including multiple stacked memory layers to store multiple data values, each memory layer of the multiple stacked memory layers having an unique hysteretic property configurable to represent a unique data value; and
    a controller having access to the plurality of resistive memory cells, the controller adapted to select a resistive memory cell of the plurality of resistive memory cells, the controller to read and to write data from and to a selected memory layer of the selected resistive memory cell.

18. The memory device of claim 17, wherein the controller is adapted to configure a hysteretic property of the selected memory layer by applying a voltage at a selected voltage level that is associated with the selected memory layer.

19. The memory device of claim 17, further comprising a plurality of internal electrodes separating adjacent memory layers of the multiple stacked memory layers.

20. The memory device of claim 17, wherein the plurality of internal electrodes are formed from a semiconductor material.

21. Original) The memory device of claim 20, wherein a first doping concentration of a first internal electrode of the plurality of internal electrodes is different from a second doping concentration of a second internal electrode of the plurality of internal electrodes.

22. The memory device of claim 20, wherein each internal electrode of the plurality of internal electrodes has a unique conductance within the selected resistive memory cell.

23. The memory device of claim 20, wherein the plurality of internal electrodes comprises a conductive metal.

24. The memory device of claim 20, further comprising a plurality of insulator layers, each insulator layer of the plurality of insulator layers associated with a respective internal electrode of the plurality of internal electrodes.

25. The memory device of claim 24, wherein insulator layers of the plurality of insulator layers have different insulator properties, and wherein internal electrodes of the plurality of internal electrodes have different electrical properties.

26. The storage device according to claim 1, wherein the different critical voltages can be due to the plurality of memory layers comprising different materials, the plurality of memory layers comprising different compositions of the same materials, the plurality of memory layers having different thicknesses, materials adjacent to the plurality of memory layers, the plurality of memory layers having different thicknesses of materials therebetween, the plurality of memory layers having different types of layers therebetween, or combinations thereof.

* * * * *